(12) United States Patent
Pan et al.

(10) Patent No.: US 8,597,961 B2
(45) Date of Patent: Dec. 3, 2013

(54) METHOD FOR IMPROVING INTERNAL QUANTUM EFFICIENCY OF GROUP-III NITRIDE-BASED LIGHT EMITTING DEVICE

(75) Inventors: Chang-Chi Pan, Taoyuan (TW); Ching-hwa Chang Jean, Taoyuan (TW); Jang-ho Chen, Taoyuan (TW)

(73) Assignee: Walsin Lihwa Corporation, Taoyuan (TW)

( * ) Notice: Subject to any disclaimer, the term of this patent is extended or adjusted under 35 U.S.C. 154(b) by 472 days.

(21) Appl. No.: 12/588,557

(22) Filed: Oct. 20, 2009

(65) Prior Publication Data

US 2011/0089398 A1 Apr. 21, 2011

(51) Int. Cl.
*H01L 21/00* (2006.01)
(52) U.S. Cl.
USPC ............. 438/22; 438/46; 438/47; 438/104; 257/13; 257/43; 257/103; 257/E33.023
(58) Field of Classification Search
USPC .......... 257/13, 103, E38.068, 43, 79, 82, 730, 257/E33.023; 977/762; 438/46–47, 57, 104, 438/125, 483, 669
See application file for complete search history.

(56) References Cited

U.S. PATENT DOCUMENTS

2005/0245054 A1* 11/2005 Sawaki et al. ............... 438/483
2010/0252859 A1* 10/2010 Son ............................. 257/103
2010/0272900 A1* 10/2010 Park et al. .................... 427/282
2010/0276665 A1   11/2010 Wang
2010/0308323 A1   12/2010 Chang Jean et al.

FOREIGN PATENT DOCUMENTS

| CN | 1434482   | 8/2003  |
|----|-----------|---------|
| TW | 200832739 | 8/2008  |
| TW | 200901284 | 1/2009  |
| TW | 200940440 | 10/2009 |

OTHER PUBLICATIONS

Taiwanese Office Action, dated Mar. 12, 2013, in a counterpart Taiwanese patent application, No. TW 098142379.
Chinese Office Action, dated Feb. 16, 2012, in a counterpart Chinese patent application, No. CN 200910259283.0.

* cited by examiner

*Primary Examiner* — Mark A Laurenzi
(74) *Attorney, Agent, or Firm* — Chen Yoshimura LLP

(57) ABSTRACT

A method for improving internal quantum efficiency of a group-III nitride-based light emitting device is disclosed. The method includes the steps of: providing a group-III nitride-based substrate having a single crystalline structure; forming on the group-III nitride-based substrate an oxide layer, having a plurality of particles, without absorption of visible light, size, shape, and density of the particles are controlled by reaction concentration ratio of nitrogen/hydrogen, reaction time and reaction temperature; and growing a group-III nitride-based layer over the oxide layer; wherein the oxide layer prevents threading dislocation of the group-III nitride-based substrate from propagating into the group-III nitride-based layer, thereby improving internal quantum efficiency of the group-III nitride-based light emitting device.

10 Claims, 7 Drawing Sheets

Island stage

METHOD FOR IMPROVING INTERNAL QUANTUM EFFICIENCY OF GROUP-III NITRIDE-BASED LIGHT EMITTING DEVICE

FIELD OF THE INVENTION

The present invention relates to a method for improving internal quantum efficiency of a light emitting device, and more particularly, to a group-III nitride-based light emitting device, such as a GaN light emitting device.

BACKGROUND OF THE INVENTION

Group-III nitride-based semiconductors are direct-transition type semiconductors exhibiting a wide range of emission spectra from UV to red light when used in a device such as a light-emitting device, and have been used in light-emitting devices such as light-emitting diodes (LEDs) and laser diodes (LDs).

When a light-emitting device has higher external quantum efficiency (the number of photons extracted to the outside/the number of injected carriers), the less power consumption can be achieved. The external quantum efficiency can be raised by increasing the light extraction efficiency (the number of photons extracted to the outside/the number of emitted photons) or the internal quantum efficiency (the number of emitted photons/the number of injected carriers). The increase of the internal quantum efficiency means the decrease of the energy of the heat converted from the electricity given to the light-emitting element. Therefore, it is considered that the increase of the internal quantum efficiency not only reduces the power consumption but also suppresses the lowering of the reliability due to the heating.

The extraction efficiency of an LED can be much improved by either growing or mechanically bonding the lower confining layer upon a transparent substrate rather than an absorbing one. The extraction efficiency of a transparent substrate LED is reduced by the presence of any layers in the LED that have an energy gap equal to or smaller than that of the light-emitting layers. This is because some of the light that is emitted by the active layer passes through the absorbing layers before it exits the LED. These absorbing layers are included because they reduce the number of threading dislocations or other defects in the active layer or are used to simplify the LED manufacturing process. Another effect is to reduce band offsets at hetero-interfaces, which lower the voltage that must be applied to the contacts in order to force a particular current through the diode. Because the absorbing layers tend to absorb shorter-wavelength light more effectively than longer-wavelength light, LEDs that emit at 590 nm suffer a greater performance penalty due to the presence of these layers than LEDs that emit at 640 nm.

Absorption in the active region also reduces the extraction efficiency. In the prior art, techniques for improving the efficiency of LEDs have focused on determining the active layer thickness which results in greatest internal quantum efficiency and on increasing the extraction efficiency of the LED by removing the absorbing substrate. The extraction efficiency can be further improved by making all absorbing layers, including the active layer, as thin as possible. However, ultra-thin active layers may result in a decrease in the internal quantum efficiency of the LED.

As mentioned above, absorbing layers are included because they reduce the number of threading dislocations, and therefore, an alternative method which can also reduce the number of threading dislocations may overcome the aforementioned problem caused by the absorbing layers.

When a group-III nitride-based semiconductor is formed on a silicon (Si) substrate, epitaxial growth process may be carried out under condition that stress owing to misfit of lattice constants between the silicon (Si) substrate and the group-III nitride-based semiconductor is always applied. Difference of thermal expansion coefficients between the silicon (Si) substrate and the group-III nitride-based semiconductor increases the stress in a cooling process, to thereby generate a lot of cracks (fractures) in the group-III nitride-based semiconductor layer. As a result, cracks generated in a region where a light-emitting device or other device is formed make the device a defective product and because of that yield rate of the device becomes remarkably poor.

When a selected growth process is carried out so as not to generate cracks, actually stress cannot be relaxed sufficiently and especially threading dislocations do not decrease. In short, generation of cracks means relaxation of stress owing to the cracks. So when the cracks are suppressed, stress is always applied to threading dislocations, and therefore, preventing upward propagation of each threading dislocation is desperately desired.

The present invention has been accomplished in an attempt to solve the aforementioned problems, and an object of the present invention is to form an oxide layer such as a ZnO layer in replace of an absorbing layer to prevent threading dislocation from propagating upwards, which may further enhance internal quantum efficiency and improve light extraction efficiency of the group-III nitride-based semiconductor.

SUMMARY OF THE INVENTION

Accordingly, the prior arts are limited by the above problems. It is an object of the present invention to provide a method for enhancing internal quantum efficiency and improving light extraction efficiency of a group-III nitride-based light emitting device.

In accordance with an aspect of the present invention, a method for improving internal quantum efficiency of a group-III nitride-based light emitting device includes the steps of: providing a group-III nitride-based substrate having a single crystalline structure; forming on the group-III nitride-based substrate an oxide layer, having a plurality of particles, without absorption of visible light, size, shape, and density of the particles are controlled by reaction concentration ratio of nitrogen/hydrogen, reaction time and reaction temperature; and growing a group-III nitride-based layer over the oxide layer; wherein the oxide layer prevents threading dislocation of the group-III nitride-based substrate from propagating into the group-III nitride-based layer, thereby improving internal quantum efficiency of the group-III nitride-based light emitting device.

Preferably, the oxide layer comprises zinc oxide (ZnO), silicon dioxide ($SiO_2$), titanium dioxide ($TiO_2$), or aluminum oxide ($Al_2O_3$).

Preferably, the oxide layer is formed by hydrothermal treatment, sol-gel method, thermal evaporation, chemical vapor deposition (CVD), or molecular beam epitaxy (MBE).

Preferably, the particles each has a cross-sectional diameter ranging from 100 nm~order of micrometers.

Preferably, the particles are formed in an environment having nitrogen/hydrogen concentration ratio larger than 1.

Preferably, the particles are formed at a temperature ranging from 400° C.~1000° C.

Preferably, the particles have a nanostructure or a microstructure.

In accordance with another aspect of the present invention, a group-III nitride-based light emitting device with improved internal quantum efficiency includes a group-III nitride-based substrate having a single crystalline structure; an oxide layer formed on the group-III nitride-based substrate, having a plurality of particles, without absorption of visible light, size, shape, and density of the particles are controlled by reaction concentration ratio of nitrogen/hydrogen, reaction time and reaction temperature; and a group-III nitride-based layer grown over the oxide layer; wherein the oxide layer prevents threading dislocation of the group-III nitride-based substrate from propagating into the group-III nitride-based layer, thereby improving internal quantum efficiency of the group-III nitride-based light emitting device.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiment. It is to be noted that the following descriptions of preferred embodiment of this invention are presented herein for purpose of illustration and description only; it is not intended to be exhaustive or to be limited to the precise form disclosed.

Figure 1:
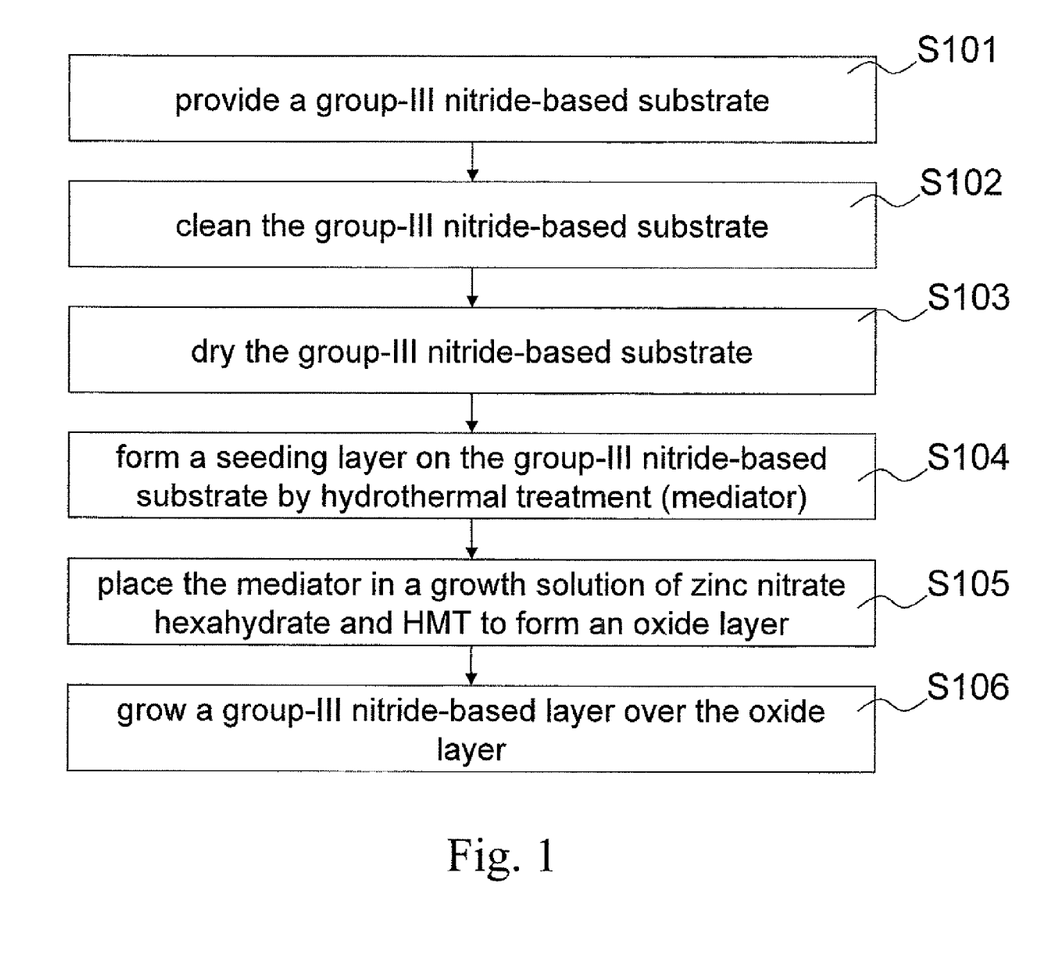
FIG. 1 is a flow chart of a preferred embodiment according to the present invention.

Please refer to FIG. 1. FIG. 1 is a flow chart of a preferred embodiment according to the present invention showing a method for improving internal quantum efficiency of a group-III nitride-based light emitting device. In this embodiment, the group-III nitride-based light emitting device refers to a GaN light emitting diode. The method of the present invention for improving internal quantum efficiency of a group-III nitride-based light emitting device includes the following steps. First, a GaN substrate preferably an undoped GaN substrate which has a single crystalline structure formed with a flat surface is provided (as shown at step S101). Formation of the GaN substrate can mainly be divided into three growth stages: nucleation stage, island stage, and film stage. The GaN substrate has a non-crystalline structure, polycrystalline structure, and single crystalline structure, respectively, in the three growth stages. In the present invention, the GaN substrate having a single crystalline structure which is in the final film growth stage is preferred because it provides a perfect nucleated base.

The GaN substrate is then cleaned with acetone, methanol, and deionized water for about 30 seconds, respectively (as shown at step S102). After the GaN substrate is cleaned, the GaN substrate is dried by a nitrogen spray gun (as shown at step S103). Next, a seed layer of zinc oxide (ZnO) is formed on a top surface of the GaN substrate for increasing adhesion (as shown at step S104). The GaN substrate having the seed layer thereon can be considered as a mediator.

The seed layer of ZnO is prepared by dissolving zinc acetate $(Zn(CH_3COO)_2 \cdot H_2O)$ in 2MOE $(CH_3O(CH_2)_2OH,$ 2-methoxyethanol), each having a concentration of 0.5M, and then stirring the resultant solution for 2 hours while heating at a temperature of 65° C., so that a transparent gel solution is obtained. Later, the transparent gel solution is spin coated onto the top surface of the GaN substrate. Next, a ZnO seed layer is obtained by thermal annealing the GaN substrate having the transparent gel solution deposited thereon at a temperature of 130° C. for 60 minutes. In this embodiment, the ZnO seed layer is used for ZnO particles to grow as a ZnO layer.

It should be understood that the seed layer is not limited to be made of ZnO, and can also be made of gold (Au), silver (Ag), Tin (Sn), or cobalt (Co). Similarly, the oxide layer is not limited to be made of ZnO, and can also be made of silicon dioxide $(SiO_2)$, titanium dioxide $(TiO_2)$, or aluminum oxide $(Al_2O_3)$. Furthermore, the oxide layer may be formed randomly or orderly.

After the seed layer is formed, the mediator is placed facing downwards in a growth solution of zinc nitrate hexahydrate $(Zn(NO_3)_2 \cdot 6H_2O)$ having a purity of 98% and hexamethylenetetramine $(C_6H_{12}N_4,$ HMT) having a purity of 99.5%, each having a concentration of 0.5M (as shown at step S105). Later, it is heated in a dryer at a low temperature of 90° C. for about 3 hours. After being heated, it is taken out and washed with deionized water. Then, a ZnO layer having a plurality of particles without absorption of visible light could be obtained.

The size, shape, and density of the particles can be controlled by reaction concentration ratio of nitrogen/hydrogen, reaction time and reaction temperature during the ZnO layer formation. The particles may have a nanostructure or a microstructure.

Figure 2A:
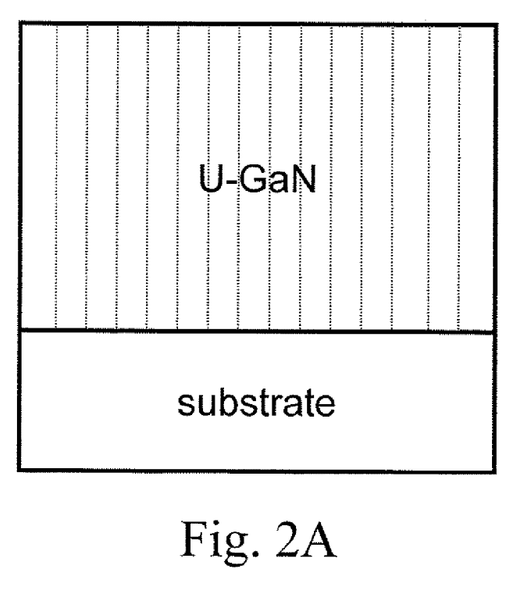
FIGS. 2A and 2B are diagrams showing a LED with and without a ZnO layer.
Figure 2B:
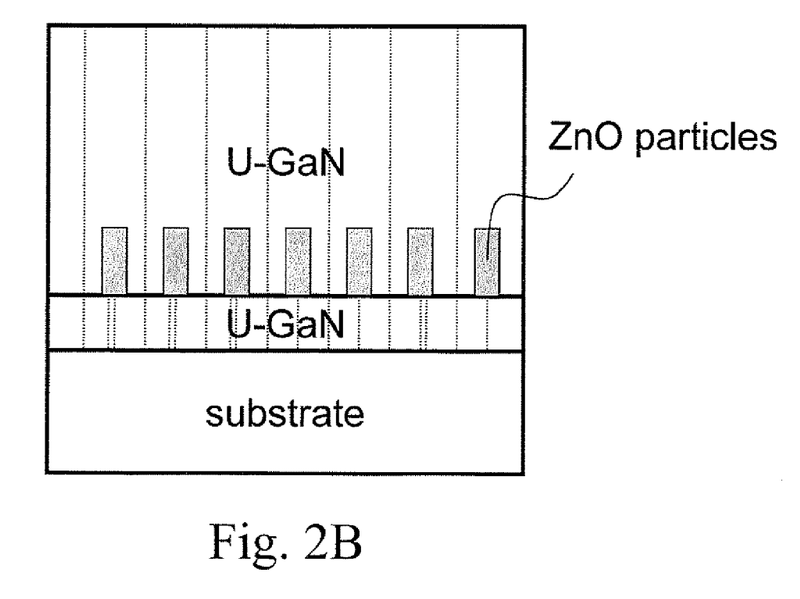
Figure 3:
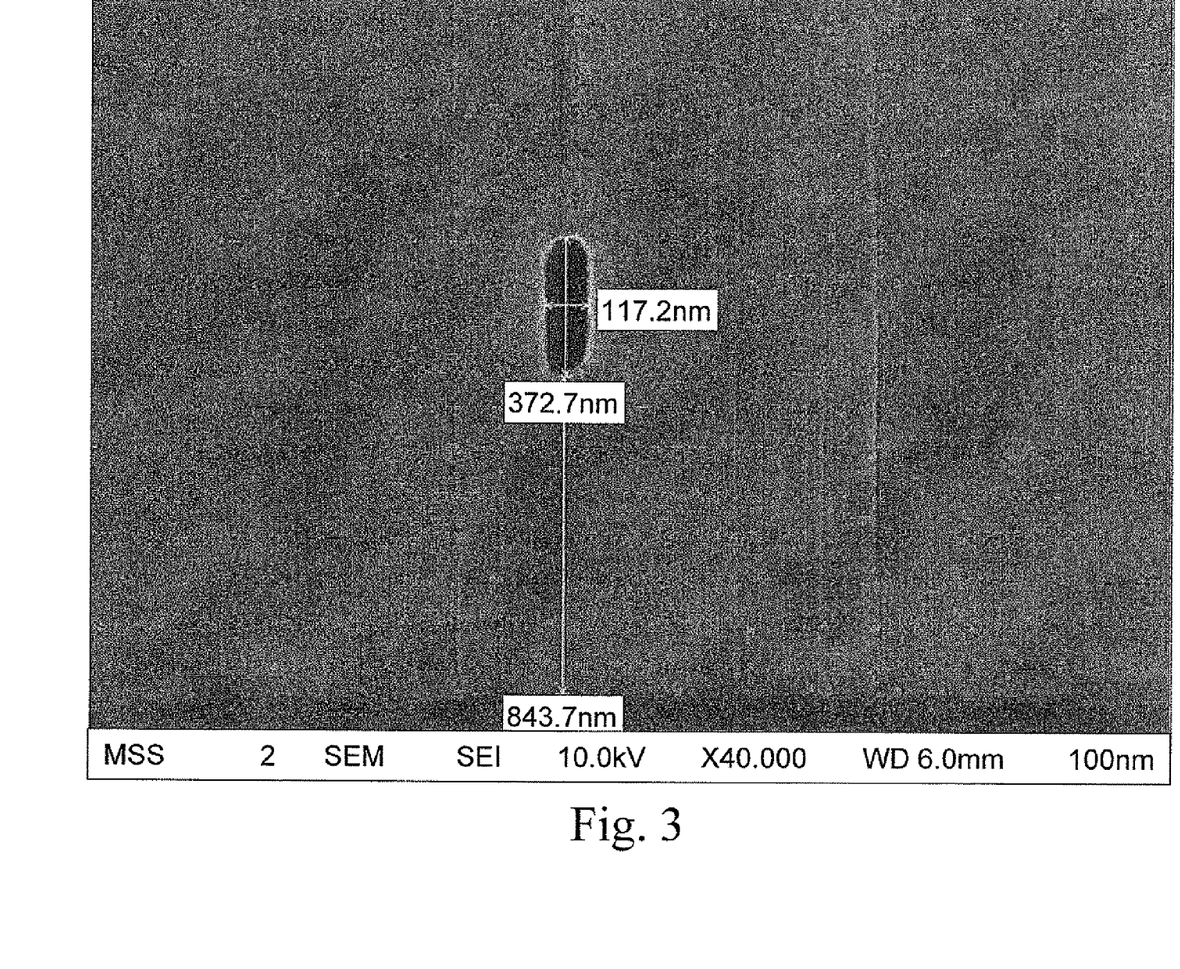
FIG. 3 is a scanning electron microscope (SEM) image showing a ZnO particle which blocks propagation of threading dislocation of GaN substrate according to the present invention.

Usually threading dislocation propagates through a GaN layer upwards to the surface as shown in FIG. 2A, which may averagely have a density of $10^9 \sim 10^{10}$ cm$^{-2}$. In the present invention, the particles of the ZnO layer can prevent threading dislocation of the GaN substrate from propagating upwards, as shown in FIG. 2B and FIG. 3, whereby threading dislocation can be reduced from $10^9 \sim 10^{10}$ cm$^{-2}$ to $1 \sim 2 \times 10^8$ cm$^{-2}$. By this way, internal quantum efficiency of the GaN light emitting device can be great improved, and therefore, it is a main object of the present invention to provide an oxide layer having particles well-aligned over the GaN substrate.

The aforementioned process for oxide layer formation is the so-called "hydrothermal treatment". During the hydrothermal treatment, ZnO is formed according to the following formulas:

$$Zn^{2+} + 2OH^- \rightarrow Zn(OH)_2$$

$$Zn(OH)_2 \xrightarrow{\Delta} ZnO + H_2O.$$

In the aforementioned deposition mechanism, ZnO begins to form onto the seed layer once the concentrations of zinc ions and hydroxide ions reach saturation. Due to anisotropic characteristic of atomic bonding, atoms tend to flow towards low energy during nucleation causing asymmetric growth in a specific direction which thereby forms a rod/thread shape array structure.

Although hydrothermal treatment is used in the present embodiment, it should be understood that the present invention is not limited to hydrothermal treatment, and can also use thermal evaporation, sol-gel method, chemical vapor deposition (CVD), or molecular beam epitaxy (MBE).

Moreover, even though spin coating is used for disposing the seed layer onto the GaN substrate in the present embodiment, it should not be limited thereto, and can also use dip coating, evaporation, sputtering, atomic layer deposition, electrochemical deposition, pulse laser deposition, metal-organic chemical vapor deposition, or thermal annealing.

As mentioned above, an oxide layer having particles well-aligned over the GaN substrate may prevent threading dislocation of the GaN substrate from propagating upwards, thereby improving internal quantum efficiency of the GaN light emitting device. Therefore, it is found that an environment having nitrogen/hydrogen concentration ratio larger than 1 at a temperature ranging from 400° C.~1000° C. could provide particles having a cross-sectional diameter ranging from 150 nm~830 nm which can provide a preferred improvement on light extraction efficiency of the GaN light emitting diode.

Figure 4:
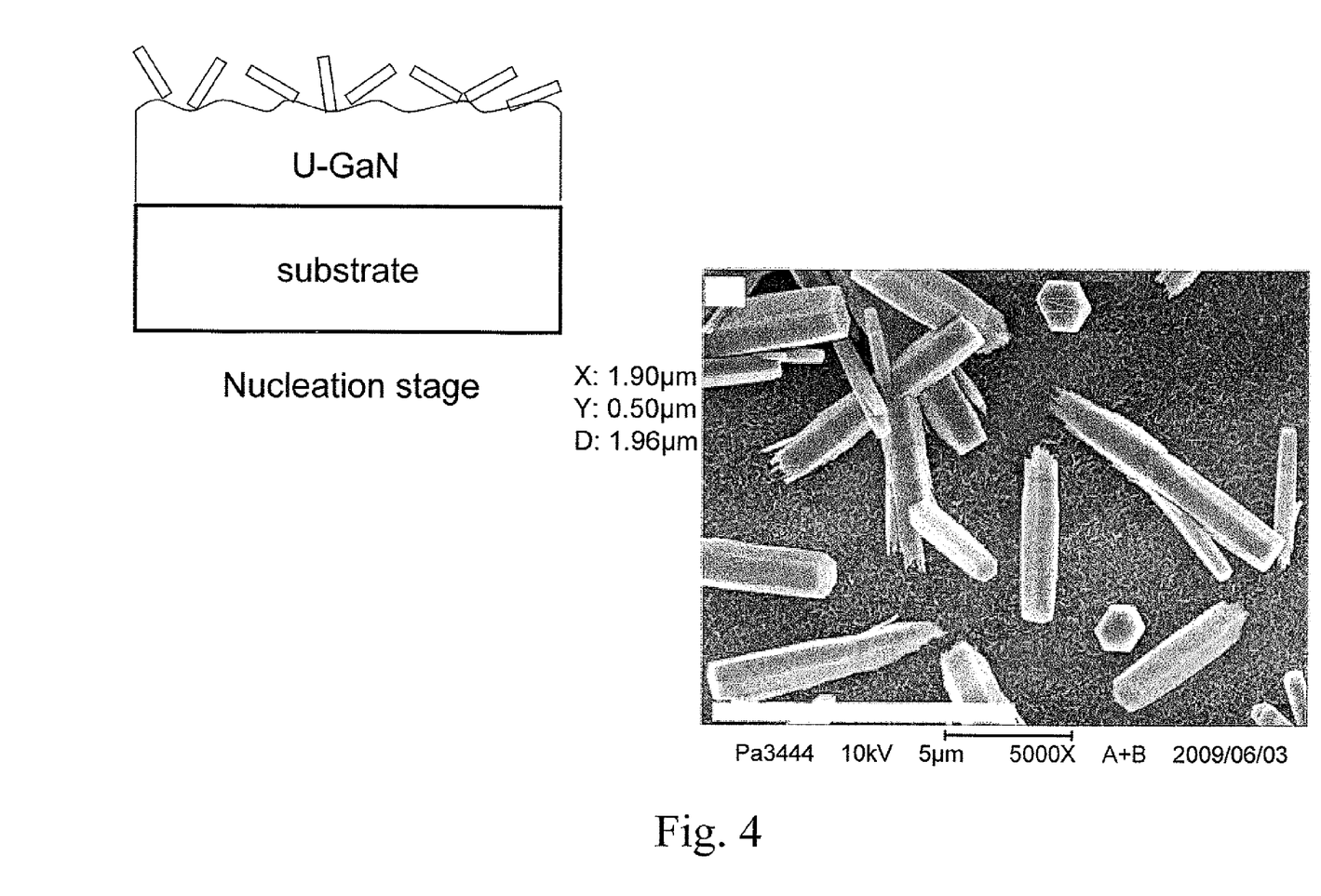
FIG. 4 is a SEM image showing ZnO particles formed on a GaN substrate in a nucleation stage.
Figure 5:
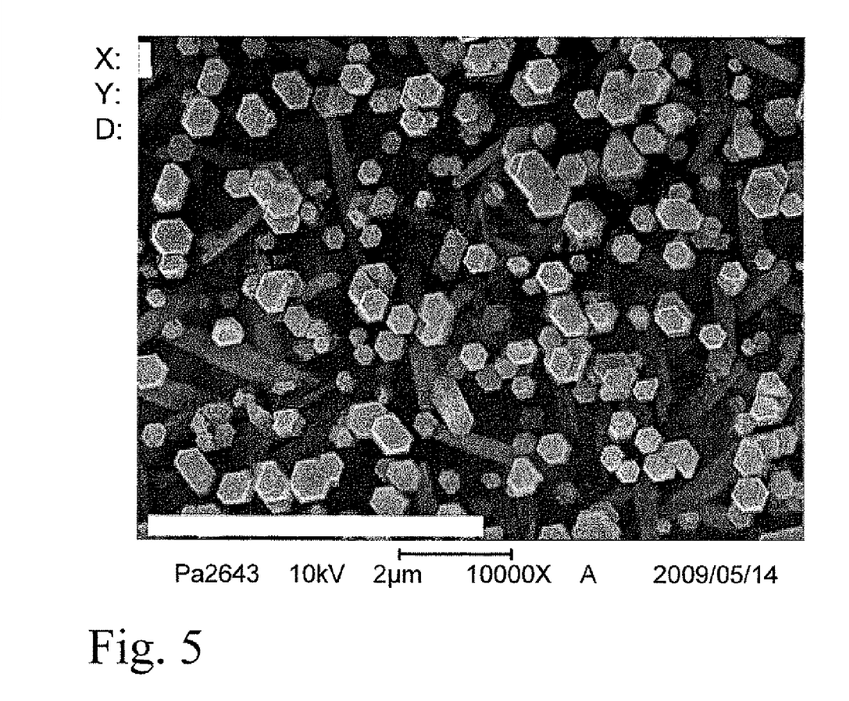
FIG. 5 is a SEM image showing ZnO particles formed on a GaN substrate in an island stage.
Figure 6:
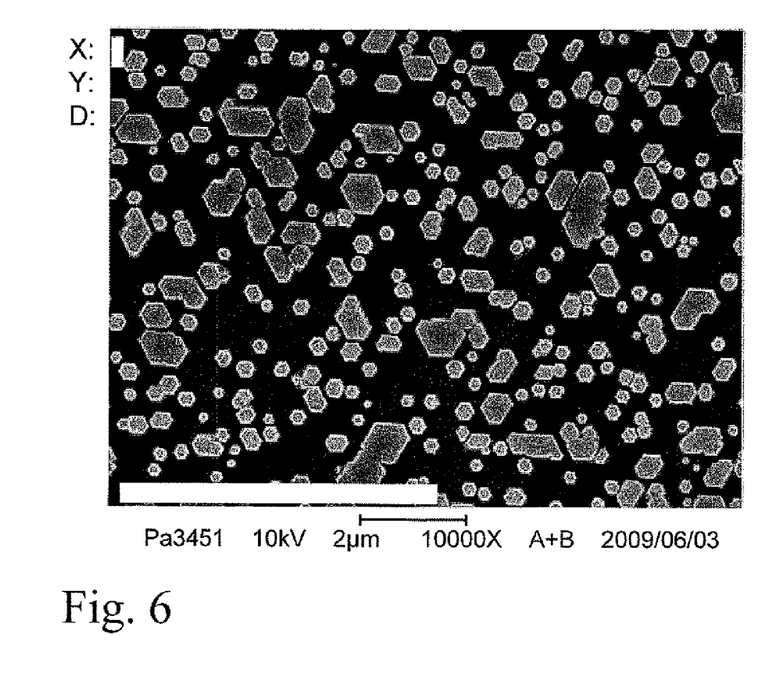
FIG. 6 is a SEM image showing ZnO particles formed on a GaN substrate in a film stage.

Furthermore, in order to form an oxide layer having particles well-aligned, an undoped GaN substrate in a film stage which has a single crystalline structure formed with a flat surface is preferred. Please refer to FIGS. 4-6. FIG. 4 is a scanning electron microscope (SEM) image showing ZnO particles formed on a GaN substrate in the nucleation stage. The ZnO particles have a cross-sectional diameter larger than 2 μm and the particles are mostly grown in irregular directions due to the fact that the GaN substrate has an amorphous crystallization in the nucleation stage. FIG. 5 is a SEM image showing ZnO particles formed on a GaN substrate in the island stage. The ZnO particles have a cross-sectional diameter ranging from 400~500 nm due to the fact that the GaN substrate has a poly-crystallization in the island stage. FIG. 6 is a SEM image showing ZnO particles formed on a GaN substrate in the film stage. The ZnO particles have a cross-sectional diameter ranging from 150~830 nm and the particles are straightly positioned and vertical to the GaN substrate due to the fact that the GaN substrate has a single crystalline structure with a flat surface in the film stage. As shown in FIGS. 4-6, it is apparent that the ZnO particles formed on the GaN substrate in the film stage are well-aligned unlike that of in FIGS. 4-6.

With the well-aligned particles of the ZnO layer, threading dislocation of the GaN substrate can be prevented from propagating upwards, and therefore, while growing another GaN layer over the ZnO layer, the newly grown GaN layer may have lesser threading dislocation since the well-aligned ZnO particles could prevent most of the threading dislocation from propagating upwards into the newly grown GaN layer (as shown at step S106). Furthermore, due to the fact that the ZnO layer is formed over a GaN substrate having a single crystalline structure with a flat surface, the ZnO layer may also provide a flat surface which enhances internal quantum efficiency and improves light extraction efficiency of a GaN light emitting device.

Figure 7:
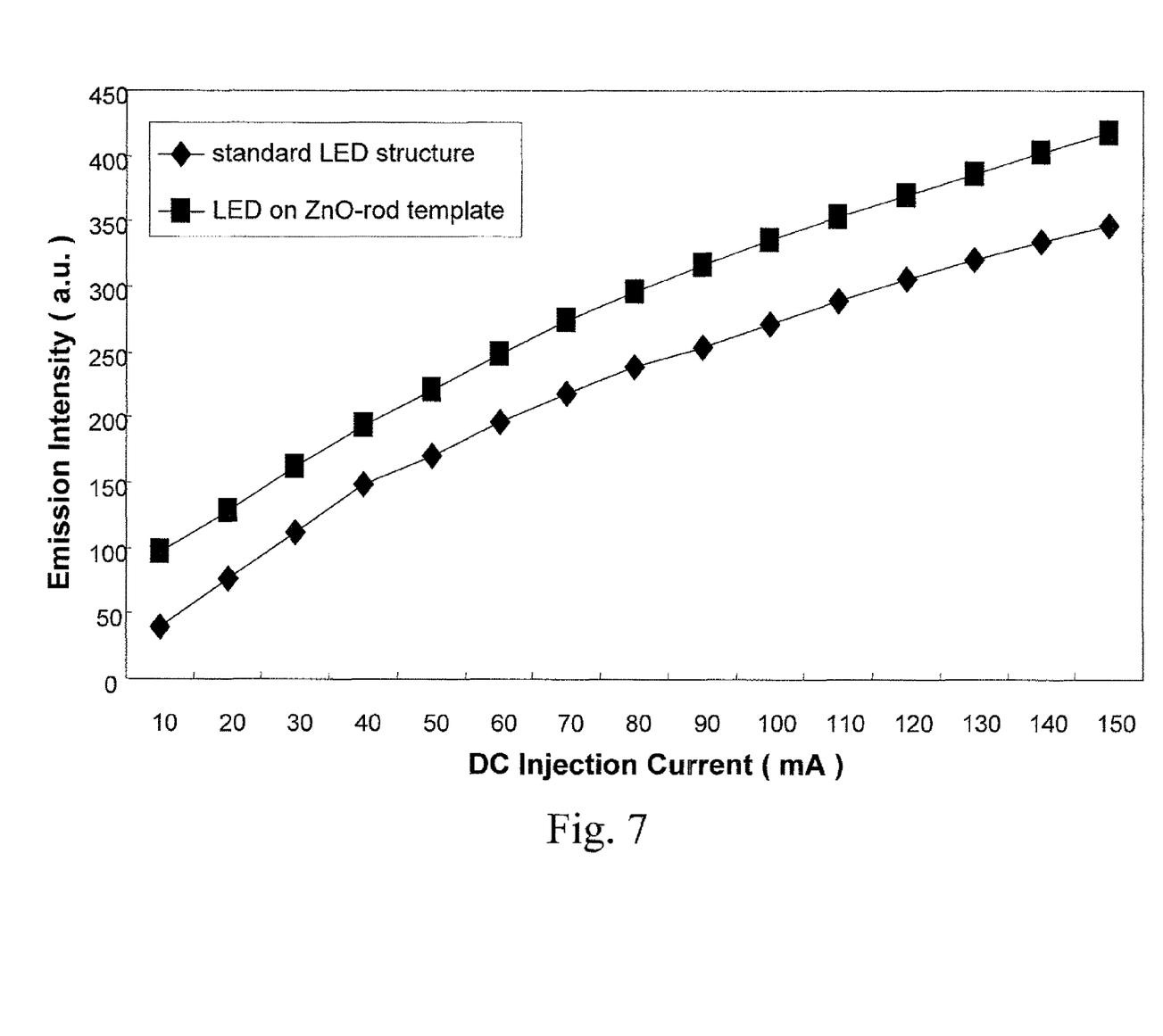
FIG. 7 is a diagram showing a relationship between emission intensity vs. DC injection current of a traditional LED and a LED of the present invention.

Please refer to FIG. 7. FIG. 7 is a diagram showing a relationship between emission intensity vs. DC injection current of a traditional LED and a LED of the present invention with the same emission wavelengths and total thicknesses. As shown in FIG. 7, output light emission intensity of the LED of the present invention is improved about 10~20%.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A method for improving internal quantum efficiency of a group-III nitride-based light emitting device, comprising the steps of:
   providing am undoped group-III nitride-based substrate having a single crystalline structure;
   coating a gel solution on the group-III nitride-based substrate;
   annealing the gel solution at an annealing temperature no higher than 150° C. to form a ZnO seed layer;
   immersing the ZnO seed layer in a growth solution, and then heating the ZnO seed layer in a dryer to form a ZnO layer having a plurality of ZnO particles, without absorption of visible light, size, shape, and density of the ZnO particles are controlled by reaction concentration ratio of nitrogen/hydrogen, reaction time and reaction temperature; and
   growing a group-III nitride-based layer over the ZnO layer;
   wherein the ZnO layer prevents threading dislocation of the undoped group-III nitride-based substrate from propagating into the group-III nitride-based layer, thereby improving internal quantum efficiency of the group-III nitride-based light emitting device.

2. The method according to claim 1, wherein the ZnO particles each has a cross-sectional diameter ranging from 100 nm~order of micrometers.

3. The method according to claim 1, wherein the ZnO particles are formed in an environment having nitrogen/hydrogen concentration ratio larger than 1.

4. The method according to claim 1, wherein the ZnO particles are formed at a temperature ranging from 400° C.~1000° C.

5. The method according to claim 1, wherein the ZnO particles have a nanostructure or a microstructure.

6. The method of claim 1, wherein the substrate is GaN having a single crystalline structure in a film and with a flat surface.

7. The method according to claim 1, wherein the gel solution comprises zinc acetate and 2-methoxyethanol.

8. The method according to claim 1, wherein the time of the annealing is no longer than 1.5 hours.

9. The method according to claim 1, growth solution comprises hexamethylenetetramine and zinc nitrate hexahydrate.

10. A method of fabricating group-III nitride-based light emitting device, comprising:
    providing a single-crystalline group-III nitride-based based substrate;
    disposing a ZnO seed layer on the single-crystalline group-III nitride-based substrate;
    forming a ZnO layer by hydrothermal treating the ZnO seed layer under 100° C., wherein the ZnO layer comprising a plurality of ZnO particles; and
    disposing a group-III nitride-based based layer over the ZnO layer.

* * * * *